(12) United States Patent
Demura

(10) Patent No.: US 11,948,812 B2
(45) Date of Patent: Apr. 2, 2024

(54) COOLING DEVICE, SUBSTRATE TREATMENT DEVICE, COOLING METHOD, AND SUBSTRATE TREATMENT METHOD

(71) Applicant: Shibaura Mechatronics Corporation, Yokohama (JP)

(72) Inventor: Kensuke Demura, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 335 days.

(21) Appl. No.: 17/321,639

(22) Filed: May 17, 2021

(65) Prior Publication Data
US 2021/0366739 A1    Nov. 25, 2021

(30) Foreign Application Priority Data

May 20, 2020  (JP) .................... 2020-087862
Mar. 16, 2021  (JP) .................... 2021-042062

(51) Int. Cl.
| | |
|---|---|
| H01L 21/67 | (2006.01) |
| B08B 3/04 | (2006.01) |
| F25B 13/00 | (2006.01) |
| H01J 37/32 | (2006.01) |
| H01L 21/02 | (2006.01) |
| H01L 21/311 | (2006.01) |

(52) U.S. Cl.
CPC .......... *H01L 21/67051* (2013.01); *B08B 3/04* (2013.01); *F25B 13/00* (2013.01); *H01J 37/32724* (2013.01); *H01L 21/02057* (2013.01); *H01L 21/31116* (2013.01); *H01L 21/31144* (2013.01); *H01L 21/67069* (2013.01); *H01L 21/67248* (2013.01); *H01J 37/321* (2013.01); *H01J 2237/002* (2013.01); *H01J 2237/3341* (2013.01)

(58) Field of Classification Search
CPC ............. H01L 21/67051; H01J 37/32724
USPC ............................................... 62/64
See application file for complete search history.

(56) References Cited

U.S. PATENT DOCUMENTS

| | | | |
|---|---|---|---|
| 2014/0283534 A1* | 9/2014 | Tandou | H01J 37/3299 62/62 |
| 2020/0126834 A1 | 4/2020 | Yamaguchi et al. | |

FOREIGN PATENT DOCUMENTS

| | | |
|---|---|---|
| CN | 111071798 A | 4/2020 |
| JP | 3211245 U | 6/2017 |

* cited by examiner

*Primary Examiner* — Steve S Tanenbaum
(74) *Attorney, Agent, or Firm* — PEARNE & GORDON LLP

(57) ABSTRACT

According to one embodiment, a cooling device includes a flow path configured to flow a refrigerant, a condenser provided in the flow path, a heat exchanger provided in the flow path, a compressor provided in the flow path between the condenser and the heat exchanger, a cooler cooling the refrigerant flowing from the condenser into the heat exchanger, a gas cooling part supplying a gas to the heat exchanger, and configured to cool the gas by exchanging heat with the refrigerant, a first thermometer configured to detect a temperature of the cooled gas, a second thermometer configured to detect a temperature of the refrigerant flowing into the heat exchanger, and a first controller configured to control the temperature of the cooled refrigerant flowing into the heat exchanger by the cooler. The first controller controls the temperature of the cooled refrigerant by switching a first control and a second control.

19 Claims, 5 Drawing Sheets

COOLING DEVICE, SUBSTRATE TREATMENT DEVICE, COOLING METHOD, AND SUBSTRATE TREATMENT METHOD

CROSS-REFERENCE TO RELATED APPLICATIONS

This application is based upon and claims the benefit of priority from Japanese Patent Application No. 2020-087862, filed on May 20, 2020; and No. 2021-042062, filed on Mar. 16, 2021; the entire contents of which are incorporated herein by reference.

FIELD

Embodiments described herein relate generally to a cooling device, a substrate treatment device, a cooling method, and a substrate treatment method.

BACKGROUND

For example, in a substrate cleaning device, an etching device, or the like, a low-temperature gas may be supplied to an object to be treated to lower the temperature of the object to be processed. In such a technique, for example, a low-temperature liquid such as liquid nitrogen is evaporated to generate a low-temperature gas, and the generated gas is supplied to an object.

However, low-temperature liquids such as liquid nitrogen have a problem that it is difficult to store them for a long period of time and to cope with an increase or decrease in the required amount, and the running cost is high. Therefore, a technique has been proposed in which a cooling device is used to cool a gas and the cooled gas is supplied to an object (see, for example, Utility Model Registration No. 3211245).

By the way, the low-temperature gas may be supplied to the object only during the treatment requiring cooling. For example, it is not necessary to supply a low temperature gas between treatments of an object. Therefore, if the amount of gas supplied during the treatment requiring cooling and between the treatments of the object is the same, the amount of wastefully consumed gas will increase.

Further, depending on the treatment of the object, a treatment requiring cooling and a treatment not requiring cooling may coexist in a series of treatment. Therefore, if the amount of gas supplied during the treatment requiring cooling and the amount of gas supplied during the treatment not requiring cooling are the same, the amount of wastefully consumed gas increases. Therefore, it is conceivable to stop the supply of the low-temperature gas or reduce the supply amount between the treatments of the object and during the treatment not requiring cooling.

However, if the supply of low-temperature gas is stopped or the supply amount is reduced during the treatment of the object or between the treatments of the object, the cooling device failure occurs frequently.

DETAILED DESCRIPTION

Figure 1:
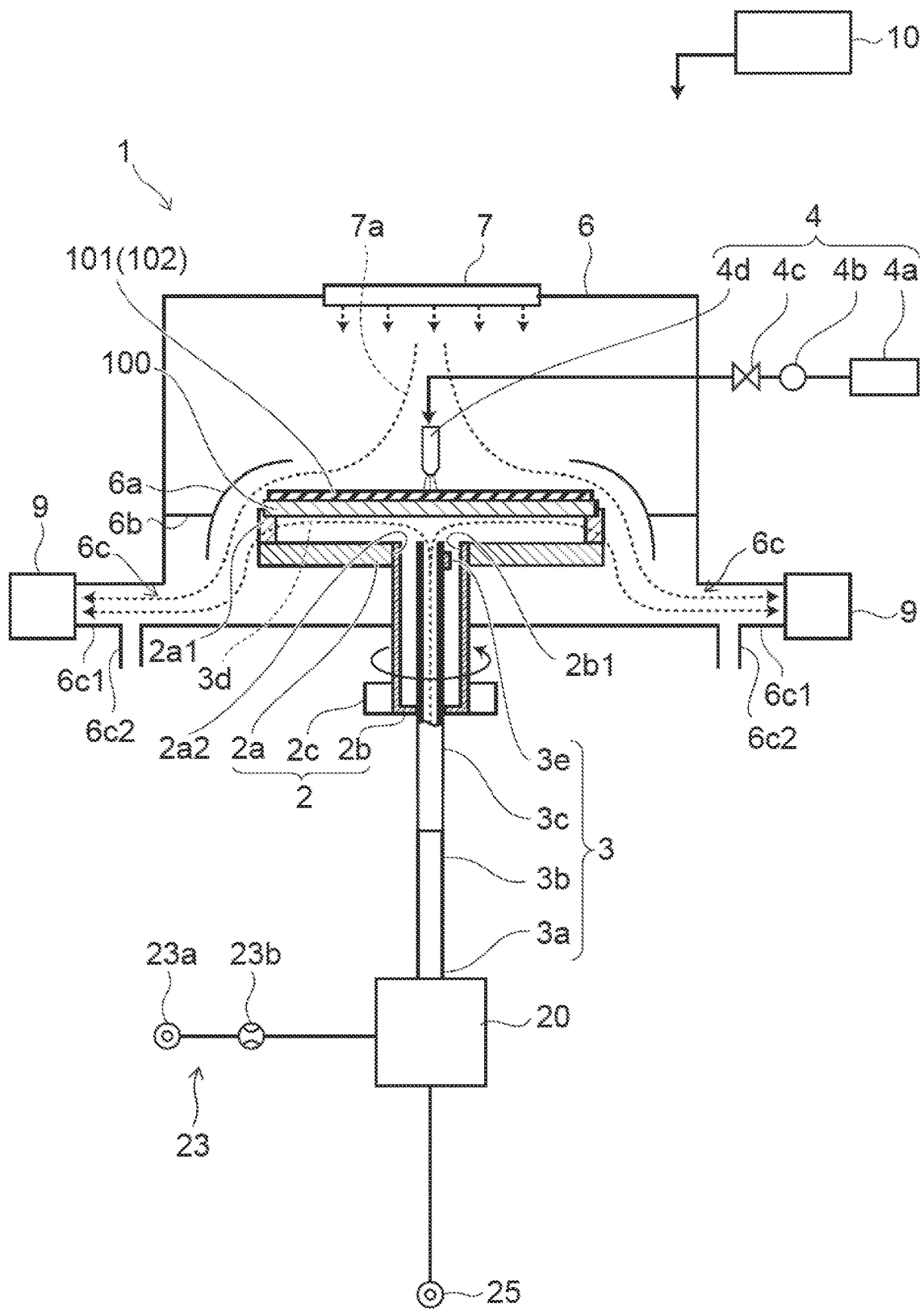
FIG. 1 is a schematic view for illustrating a substrate treatment device including a cooling device according to the embodiment.

According to one embodiment, a cooling device includes a flow path configured to flow a refrigerant, a condenser provided in the flow path, a heat exchanger provided in the flow path, a compressor provided in the flow path between the condenser and the heat exchanger, a cooler cooling the refrigerant flowing from the condenser into the heat exchanger, a gas cooling part supplying a gas to the heat exchanger, and configured to cool the gas by exchanging heat with the refrigerant, a first thermometer configured to detect a temperature of the cooled gas by the gas cooling part, a second thermometer configured to detect a temperature of the refrigerant flowing into the heat exchanger, and a first controller configured to control the temperature of the cooled refrigerant by the cooler. The refrigerant flows into the heat exchanger. The first controller controls the temperature of the cooled refrigerant flowing into the heat exchanger by switching a first control and a second control. The first control is based on the temperature detected by the first thermometer. The second control is based on the temperature detected by the second thermometer.

Various embodiments are described below with reference to the accompanying drawings.

In the specification and drawings, components similar to those described previously or illustrated in an antecedent drawing are marked with like reference numerals, and a detailed description is omitted as appropriate.

The cooling device according to the embodiment can be used, for example, as a substrate cleaning device, an etching device, or the like. However, the application of the cooling device is not limited to these, and it can also be used, for example, when a low-temperature gas is supplied to the heat-treated substrate to cool it. That is, it can be used for supplying a low-temperature gas to an object.

Here, as an example, a cooling device 20 that can be used for cleaning a substrate 100 will be described. Therefore, the substrate 100 illustrated below can be, for example, a semiconductor wafer, a template for imprinting, a mask substrate for photolithography, a plate-like body used for MEMS (Micro Electro Mechanical Systems), or the like. However, the use of the substrate 100 is not limited to these. For example, the substrate 100 can be used to calcine an organic film.

FIG. 1 is a schematic view for illustrating a substrate treatment device 1 including the cooling device 20 according to the embodiment.

The "substrate treatment device 1 including the cooling device 20" is not only when the cooling device 20 is built in the substrate treatment device 1, but also when the cooling device 20 and the substrate treatment device 1 are separate bodies. The case where the cooling device 20 is connected to the substrate treatment device 1 via a piping or the like is also included.

The substrate treatment device 1 according to the embodiment is a device that cleans contaminations existing on the surface of the substrate 100 by supplying a cleaning treatment liquid to the surface of the substrate 100, cooling the cleaning treatment liquid, freezing it, thawing it, and discharging it.

The contaminations are particles, and foreign matters, etc.

Figure 2:
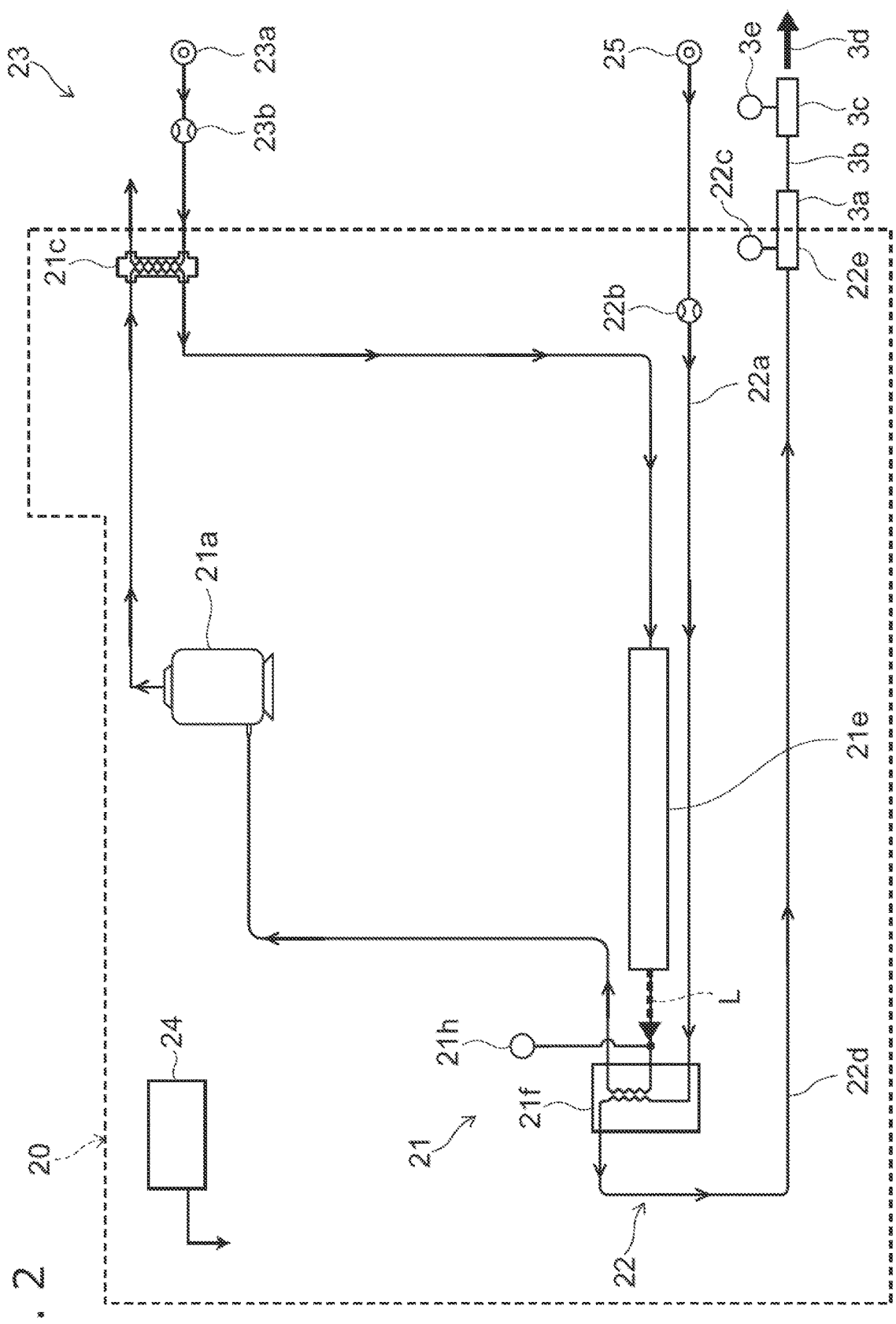
FIG. 2 is a system diagram of the cooling device.

FIG. 2 is a system diagram of the cooling device 20.

As shown in FIG. 1, the substrate treatment device 1 can be provided with a placement part 2, the cooling device 20, a cooling gas supplier 3, a liquid supplier 4, a housing 6, a blower part 7, an exhaust part 9, and a controller 10 (corresponding to an example of the second controller).

The placement part 2 includes a placement stand 2a, a rotating shaft 2b, and a drive part 2c.

The placement stand 2a is provided inside the housing 6. The placement stand 2a has a plate shape. Multiple protrusions 2a1 for holding the substrate 100 are provided on one main surface of the placement stand 2a. The substrate 100 is placed on the multiple protrusions 2a1. When the substrate 100 is placed, the surface of the substrate 100 to be cleaned is made to face in an opposite direction to the placement stand 2a side. The surface to be cleaned is, for example, a surface on which unevenness is formed, and the unevenness can be, for example, a pattern.

The multiple protrusions 2a1 hold the periphery of the substrate 100. A hole 2a2 piercing the thickness direction of the placement stand 2a is provided in the central portion of the placement stand 2a.

One end of the rotating shaft 2b is fitted into the hole 2a2 of the placement stand 2a. The other end of the rotating shaft 2b is provided on the outside of the housing 6. The rotating shaft 2b is connected to the drive part 2c outside the housing 6.

The rotating shaft 2b has a tubular shape. A blowout portion 2b1 is provided at the end portion of the rotating shaft 2b on the placement stand 2a side. When the substrate 100 is placed on the placement stand 2a, the opening of the blowout portion 2b1 faces the surface of the substrate 100 on the placement part 2 side. The hole 2a2 of the placement stand 2a and a tip of a cooling nozzle 3c described later may be referred to as the blowout portion 2b1.

The end portion of the rotating shaft 2b opposite to the placement stand 2a side is closed. The cooling nozzle 3c, which will be described later, is inserted into the end portion of the rotating shaft 2b on the side opposite to the placement stand 2a. A rotation shaft seal (not shown) is provided between the end portion of the rotary shaft 2b on the side opposite to the placement stand 2a and the cooling nozzle 3c. Therefore, the rotating shaft 2b can rotate with the cooling nozzle 3c fixed. Further, the end portion of the rotating shaft 2b on the side opposite to the placement stand 2a is sealed by the rotating shaft seal (not shown) so as to be airtight.

The drive part 2c is provided outside the housing 6. The drive part 2c is connected to the rotating shaft 2b. The rotational force of the drive part 2c is transmitted to the placement stand 2a via the rotation shaft 2b. Therefore, the drive part 2c can rotate the placement stand 2a and, by extension, the substrate 100 placed on the placement stand 2a. Further, the drive part 2c can change not only the start and stop of rotation but also the rotations per minute (rotation speed). The drive part 2c may be provided with a control motor such as a servo motor, for example.

The cooling device 20 cools the gas and supplies the cooled gas (cooling gas 3d) to the cooling gas supplier 3.

As shown in FIG. 2, the cooling device 20 can be provided with a circulation part 21, a gas cooling part 22, and a controller 24 (corresponding to an example of a first controller).

The circulation part 21 includes a compressor 21a, a condenser 21c, a cooler 21e, a heat exchanger 21f, and a thermometer 21h (corresponding to an example of a second thermometer). The circulation part 21 is provided with a flow path (piping) through which the refrigerant L can flow. The compressor 21a, the condenser 21c, the cooler 21e, the heat exchanger 21f, and the thermometer 21h can be provided in the flow path.

The compressor 21a is provided in the flow path between the condenser 21c and the heat exchanger 21f. The compressor 21a sends out a gaseous refrigerant L toward the condenser 21c to circulate the refrigerant L between the condenser 21c and the heat exchanger 21e. The refrigerant L can be, for example, a mixture of fluorocarbons, argon, krypton, and the like. The fluorocarbons are, for example, chlorofluorocarbon (CFC), hydrochlorofluorocarbon (HCFC), hydrofluorocarbon (HFC) and the like.

The condenser 21c cools and aggregates the gaseous refrigerant L sent from the compressor 21a. The condenser 21c turns the gaseous refrigerant L into a liquid refrigerant L. For example, the condenser 21c is supplied with a coolant by the refrigerant cooling part 23, which will be described later. The condenser 21c can change the gaseous refrigerant L into a liquid refrigerant L by performing heat exchange between the gaseous refrigerant L and the coolant. Although the liquid-cooled condenser 21c has been illustrated, an air-cooled condenser 21c or the like can also be used.

The cooler 21e cools the liquid refrigerant L made into a liquid state by, for example, the condenser 21c, and flowing into the heat exchanger 21f. As the cooler 21e, for example, a known cooling equipment such as an evaporator and a cascade condenser can be used. It is also possible to have a structure in which the evaporator or the cascade capacitor is combined in multiple stages. The cooler 21e is provided with an expansion valve and a capillary tube (not shown) that reduce the pressure of the refrigerant L (expand the refrigerant L) so that the refrigerant L can easily evaporate. Further, the cooler 21e can not only cool the refrigerant L but also attach a heating part for heating.

The heat exchanger 21f exchanges heat with the refrigerant L that has been liquefied by the condenser 21c. The heat exchanger 21f is cooled by the refrigerant L, and the cooled heat exchanger 21f exchanges heat with the gas to be cooled. The liquid refrigerant L evaporates by heat exchange with the heat exchanger 21f. The gaseous refrigerant L flows into the compressor 21a and is sent to the condenser 21c by the compressor 21a.

The thermometer 21h detects the temperature of the liquid refrigerant L flowing into the heat exchanger 21f. The thermometer 21h may directly detect the temperature of the liquid refrigerant L flowing in the piping, or may indirectly detect the temperature of the liquid refrigerant L by detecting the temperature of the piping. The thermometer 21h can be, for example, a thermocouple or the like.

The gas cooling part 22 supplies gas to the heat exchanger 21f, and supplies the gas cooled by the heat exchanger 21f (cooling gas 3d) to the cooling gas supplier 3 (connection part 3a). That is, the gas cooling part 22 can supply gas to the heat exchanger 21f and cool the gas by heat exchange with the refrigerant L.

The gas cooling part 22 includes a flow path 22a, a flow rate controller 22b, a flow path 22d, a discharge port 22e, and a thermometer 22c (corresponding to an example of a first thermometer). The flow path 22a is a member that connects a gas supplier 25 described later and the heat exchanger 21f. A known piping can be used for the flow path 22a. For example, stainless steel or copper can be used as the material. The flow path 22a supplies the gas supplied from the gas supplier 25 to the heat exchanger 21f. The flow rate controller 22b is provided in the flow path 22a.

The flow rate controller 22b controls the flow rate of the gas supplied to the heat exchanger 21f. The flow rate controller 22b can be, for example, an MFC (Mass Flow Controller) or the like. Further, the flow rate controller 22b may indirectly control the gas flow rate by controlling the gas supply pressure. In this case, the flow rate controller 22b can be, for example, an APC (Auto Pressure Controller) or the like.

The flow path 22d is a member that connects the heat exchanger 21f and the discharge port 22e. A known piping can be used for the flow path 22d. For example, stainless steel or copper can be used as the material. The flow path 22d supplies the gas (cooling gas 3d) cooled by the heat exchanger 21f to the discharge port 22e.

The discharge port 22e is a discharge port from which the cooling gas 3d is discharged. The discharge port 22e is connected to the cooling gas supplier 3 via the connection part 3a of the substrate treatment device 1 described later. The discharge port 22e is provided with the thermometer 22c.

The thermometer 22c detects the temperature of the cooling gas 3d at the discharge port 22e. The thermometer 22c may directly detect the temperature of the cooling gas 3d flowing through the discharge port 22e, or may indirectly detect the temperature of the cooling gas 3d by detecting the temperature of the discharge port 22e. The thermometer 22c can be, for example, a thermocouple or the like. It is sufficient that the temperature of the cooling gas 3d flowing through the discharge port 22e or the temperature of the piping can be measured.

The gas supplier 25 is a supply source that supplies the gas to be cooled toward the cooling device 20. The gas supplier 25 is connected to the flow path 22a provided with the flow rate controller 22b, for example, via a connection part (not shown).

The gas supplied to the gas cooling part 22 may be appropriately selected as long as it can cool the substrate 100 to a required temperature. For example, it is a gas that does not easily react with the material of the substrate 100, can obtain a temperature required for the treatment of the substrate 100, and can be in a gas state at the required temperature. The gas supplied to the gas cooling part 22 can be, for example, an inert gas such as nitrogen gas, helium gas, or argon gas. In this case, the cooling time of the substrate 100 can be shortened by using a gas having a high specific heat. For example, if helium gas is used, the cooling time of the substrate 100 can be shortened. Further, if a relatively inexpensive nitrogen gas is used, the processing cost of the substrate 100 can be reduced. The gas supplier 25 can be, for example, a high-pressure cylinder in which gas is stored, a factory piping capable of supplying gas, or the like.

The refrigerant cooling part 23 supplies the coolant to the condenser 21c. The coolant is not particularly limited. The coolant can be, for example, water.

The refrigerant cooling part 23 includes a supply source 23a and a flow rate controller 23b.

The supply source 23a supplies the coolant for the condenser 21c. The supply source 23a can be, for example, a supply device such as a tank storing the coolant and a pump. Further, the supply source 23a may be, for example, a factory piping for supplying the cooling liquid. The coolant flowing out of the condenser 21c can be returned to the tank described above or discharged to the drain of the factory.

The flow rate controller 23b controls the flow rate of the coolant supplied to the condenser 21c. Further, the flow rate controller 23b can also have a function of switching between supply of the coolant and stop of the supply.

Although the refrigerant cooling part 23 in the case of the condenser 21c being liquid-cooled is illustrated, the condenser may be gas-cooled, or may be air-cooled. When the condenser 21c is air-cooled, the refrigerant cooling part 23 can be, for example, a blower fan.

The controller 24 controls the operation of each element provided in the cooling device 20.

The controller 24 controls, for example, the flow rate controller 22b and controls the supply amount of the gas to be cooled. Further, the cooler 21e is controlled to control the temperature of the refrigerant L.

The controller 24 can store the first preset temperature which is a target temperature of the cooling gas 3d in the treatment of the substrate 100 in advance. The first preset temperature may have a temperature range including the target temperature.

In addition, the controller 24 can store the second preset temperature and the threshold value, which will be described later, in advance. The first preset temperature, the second preset temperature, and the threshold value can be input to the controller 24 by the operator using an input device (not shown).

Next, returning to FIG. 1, other elements provided in the substrate treatment device 1 will be described.

As shown in FIG. 1, the cooling gas supplier 3 directly supplies the cooling gas 3d to the surface (the surface on the placement stand 2a side) opposite to the surface on which the substrate 100 is cleaned.

The cooling gas supplier 3 includes the connection part 3a, a piping 3b, the cooling nozzle 3c, and a thermometer 3e (corresponding to an example of a first thermometer). The connection part 3a and the piping 3b are provided outside the housing 6.

The connection part 3a is a member for connecting the discharge port 22e and the piping 3b of the cooling device 20.

The piping 3b has a hollow cylindrical shape and connects the cooling device 20 and the cooling nozzle 3c. One end of the piping 3b is connected to the cooling device 20 via the connection part 3a. The other end of the piping 3b is connected to the cooling nozzle 3c via a connection part (not shown). A known material can be used for the piping 3b. For example, stainless steel or copper can be used.

The cooling nozzle 3c has a tubular shape and is inserted into the rotation shaft 2b through a gap. The cooling nozzle 3c supplies the cooling gas 3d to the substrate 100. The cooling gas 3d discharged from the cooling nozzle 3c is directly supplied to the surface of the substrate 100 on the placement part 2 side.

The thermometer 3e detects the temperature of the cooling gas 3d in the cooling nozzle 3c. The thermometer 3e is preferably provided in the vicinity of the discharge port of the cooling nozzle 3c. By doing so, the difference between the temperature of the cooling gas 3d supplied to the surface of the substrate 100 on the placement part 2 side and the temperature of the cooling gas 3d detected by the thermometer 3e can be reduced.

The thermometer 3e may directly detect the temperature of the cooling gas 3d flowing through the cooling nozzle 3c, or may indirectly detect the temperature of the cooling gas 3d by detecting the temperature of the cooling nozzle 3c. The thermometer 3e can be, for example, a thermocouple or the like. It is sufficient that the temperature of the cooling gas 3d flowing through the cooling nozzle 3c or the temperature of the piping can be measured.

The liquid supplier 4 supplies a liquid 101 to the surface of the substrate 100 to be cleaned. The liquid 101 can be, for example, water (for example, pure water or ultrapure water, etc.), and liquid including water as a main component, or the like.

When liquid including water as a main component is used, if the amount of components other than water is too large, it becomes difficult to utilize the physical force associated with the increase in volume, so that the removal ratio of contaminations may decrease. Therefore, the concentration of components other than water is preferably not less than 5 wt % and not more than 30 wt %.

The liquid supplier 4 includes a liquid storage part 4a, a supplier 4b, a flow rate controller 4c, and a liquid nozzle 4d. The liquid storage part 4a stores the liquid 101.

The supplier 4b is connected to the liquid storage part 4a via a piping. The supplier 4b supplies the liquid 101 toward the liquid nozzle 4d. The supplier 4b can be, for example, a pump or the like.

The flow rate controller 4c is connected to the supplier 4b via a piping. The flow rate controller 4c controls the flow rate of the liquid 101 supplied by the supplier 4b, and switches between supply and stop of the liquid 101. The flow rate controller 4c can be, for example, a flow rate control valve. The liquid nozzle 4d has a tubular shape and is provided inside the housing 6. One end of the liquid nozzle 4d is connected to the flow controller 4c via a piping. The other end of the liquid nozzle 4d faces the surface of the substrate 100 for cleaning. The liquid 101 discharged from the liquid nozzle 4d is supplied to the surface of the substrate 100 to be cleaned.

The housing 6 has a box shape. A cover 6a is provided inside the housing 6. The cover 6a receives the liquid 101 supplied to the substrate 100, and discharged to the outside of the substrate 100 by rotating the substrate 100. The cover 6a has a tubular shape. The end portion of the cover 6a opposite to the placement stand 2a side (upper end portion in FIG. 1) is bent toward the center of the cover 6a. Therefore, it is possible to easily capture the liquid 101 scattered above the substrate 100.

Further, a partition plate 6b is provided inside the housing 6. The partition plate 6b is provided between the outer surface of the cover 6a and the inner surface of the housing 6.

A discharge port 6c is provided on the side surface of the housing 6 on the bottom surface side. The used cooling gas 3d, the air 7a in the housing 6, and the used liquid 101 are discharged to the outside of the housing 6 from the discharge port 6c. An exhaust pipe 6c1 is connected to the exhaust port 6c, and an exhaust part 9 for exhausting the used cooling gas 3d and the air 7a in the housing 6 is connected to the exhaust pipe 6c1. Further, a discharge pipe 6c2 for discharging the used liquid 101 is also connected to the discharge port 6c. The discharge port 6c is provided below the substrate 100 placed on the placement part 2.

The blower part 7 is provided on the ceiling surface of the housing 6. The blower part 7 can also be provided on the side surface of the housing 6 on the ceiling side. The blower part 7 may be provided with a filter and a blower such as a fan. The filter can be, for example, a HEPA filter (High Efficiency Particulate Air Filter) or the like. The blower part 7 supplies the air 7a (outside air) to the space between the partition plate 6b and the ceiling of the housing 6.

The controller 10 may include a calculation part such as a CPU and a storage part such as a memory. The controller 10 controls the operation of each element provided in the substrate treatment device 1 based on the control program stored in the storage part.

The controller 10 controls, for example, the flow rate controller 4c to control the supply amount of the liquid 101. Further, the controller 10 controls the drive part 2c to rotate the substrate 100. For example, the controller 10 rotates the substrate 100 to control the supplied liquid 101 so as to spread over the entire region of the substrate 100, or discharge the liquid 101 from the substrate 100.

Further, the controller 10 can control the controller 24 of the cooling device 20. For example, the controller 10 issues a command to the controller 24 so that the controller 24 controls the flow rate controller 22b to change the flow rate of the cooling gas 3d.

(Substrate Treatment Operation)

Next, the operation (action) of the substrate treatment device 1 will be described with reference to FIG. 3.

Figure 3:
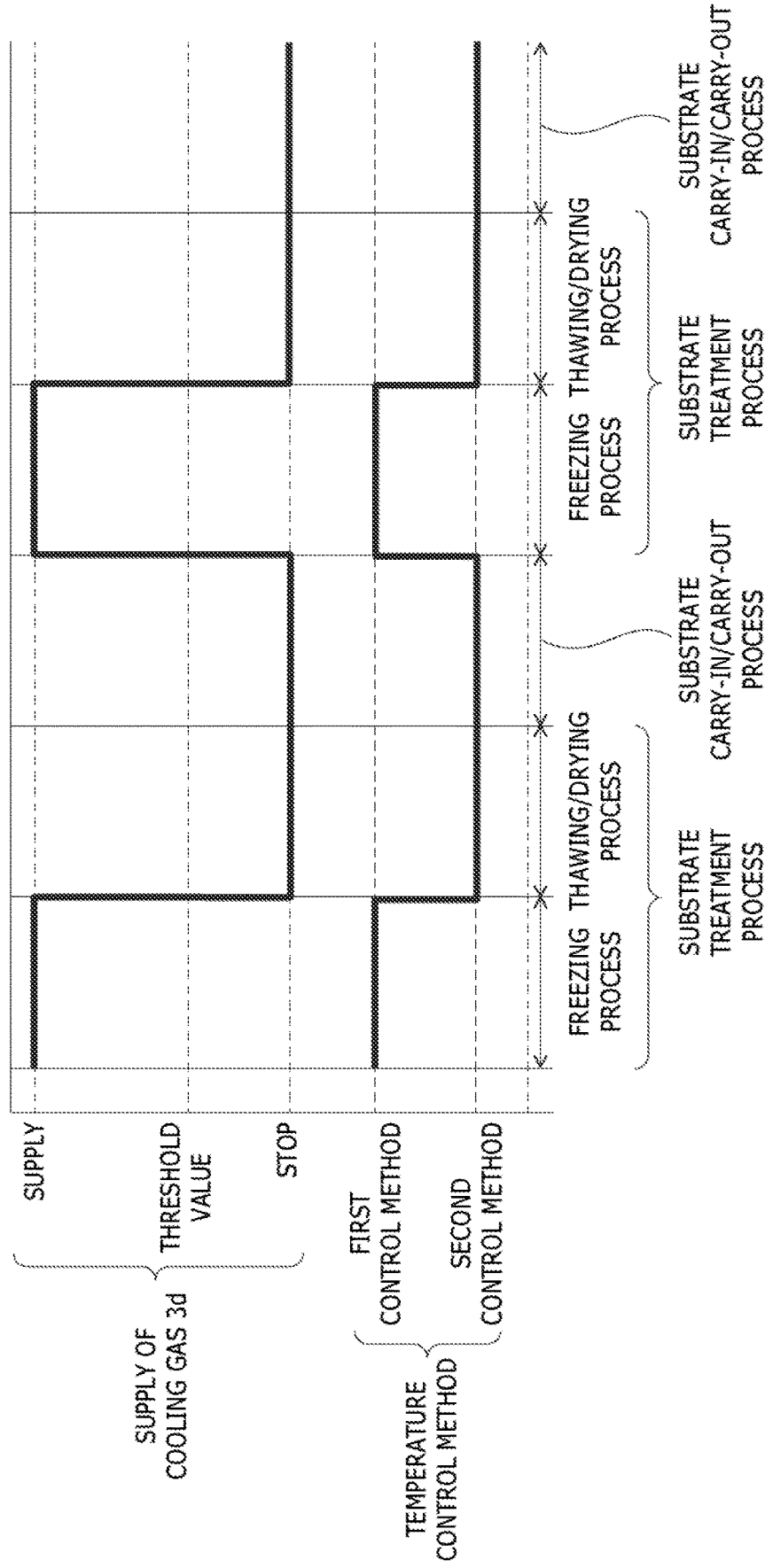
FIG. 3 is a timing chart for illustrating the operation of the substrate treatment device.

FIG. 3 is a timing chart for illustrating the operation of the substrate treatment device 1.

FIG. 3 shows a case where the substrate 100 is a 6025 quartz (Qz) substrate (152 mm×152 mm×6.35 mm) and the liquid 101 is pure water.

As described above, the substrate treatment device 1 according to the embodiment supplies the cleaning treatment liquid to the surface of the substrate 100, cools and freezes the cleaning treatment liquid, and then thaw and discharges the cleaning treatment liquid.

Then, the substrate treatment device 1 cleans the contaminants existing on the surface of the substrate 100 by executing the above-mentioned plurality of processes. The process of cleaning the contaminants existing on the surface of the substrate 100 is called a cleaning process.

As shown in FIG. 3, this cleaning treatment is divided into a substrate treatment process for cleaning and a substrate carry-in/carry-out process for carry-in/carry-out the substrate 100 to be cleaned into the substrate treatment device 1.

In the substrate treatment device 1, in the substrate treatment process, a liquid film is formed on the surface to be cleaned of the substrate 100 that has been carried into the housing 6 in advance, and the liquid film is cooled and frozen. After that, the surface to be cleaned of the substrate 100 is cleaned by performing a thawing/drying process of removing the thawed liquid film and drying it. After cleaning the substrate 100, a substrate carry-in/carry-out process is performed in which the treated substrate 100 is carried out from the housing 6 and the untreated substrate 100 is carried into the housing 6.

Below, the freezing process, thawing/drying process, and substrate carry-in/carry-out process will be explained in this order.

First, in the freezing process, the controller 10 controls the flow rate controller 4c to supply the liquid 101 to the substrate 100 from the liquid nozzle 4d. Next, the controller 10 controls the drive part 2c to rotate the substrate 100 to form a liquid film on the substrate 100.

Next, the controller 10 issues a command to the controller 24 of the cooling device 20 to supply the cooling gas 3d to the substrate 100. The controller 24 controls the flow rate controller 22b to supply nitrogen gas to the heat exchanger 21f. The supplied nitrogen gas is cooled by the heat exchanger 21f and discharged from the cooling nozzle 3c. This cooled nitrogen gas is the cooling gas 3d. In the embodiment, the cooling gas 3d is discharged to the substrate 100 at a temperature and a flow rate required for freezing the liquid film. For example, the liquid film on the substrate 100 is frozen by being discharged the cooling gas 3d from the cooling nozzle 3c to the substrate 100 at a flow rate of about −120° C. to 30° C. and 40 NL/min to 200 NL/min. At this time, the supply of the liquid 101 to the substrate 100 is stopped.

Next, in the thawing/drying process, the controller 10 issues a command to the controller 24 of the cooling device 20 to stop the supply of the cooling gas 3d. The controller 24 controls the flow rate controller 22b to stop the supply of the cooling gas 3d. Then, the controller 10 controls the flow rate controller 4c to supply the liquid 101 to the substrate 100 again to thaw the frozen liquid film. After thawing, the supply of the liquid 101 to the substrate 100 is stopped, and the substrate 100 is dried by rotating the substrate 100. After drying, the rotation of the substrate 100 is stopped.

The freezing process and the thawing/drying process are collectively called the substrate treatment process. Therefore, when the thawing/drying process is completed and the substrate 100 is dried, the treatment of cleaning the substrate 100 is completed.

Next, in the substrate carry-in/carry-out process, the treated substrate 100 is carried out of the housing 6 through a carry-in/carry-out port (not shown) of the housing 6. When the removal of the treated substrate 100 is completed, the presence or absence of the untreated substrate 100 is confirmed. If the untreated substrate 100 is present, the untreated substrate 100 is carried into the housing 6 and placed on the multiple protrusions 2a1 of the placement stand 2a. Then, the process returns to the substrate treatment process and the above treatment is repeated.

If there is no untreated substrate 100, the controller 10 stops the operation of the substrate treatment device 1 after carrying out the treated substrate 100.

As described above, as shown in FIG. 3, in the embodiment, the cooling gas 3d by the cooling device 20 is supplied in the freezing process and stopped in the thawing/drying process and the substrate carry-in/carry-out process.

When the substrate treatment device 1 starts the operation, the cooling device 20 also starts the operation. At this time, the controller 24 refers to the first preset temperature, which is the temperature target value of the gas, and controls the cooler 21e so that the temperature of the second thermometer 21h becomes the first preset temperature. The temperature of the refrigerant L is adjusted by the controller 24 controlling the cooler 21e.

Then, at the time of substrate treatment, the controller 24 controls the cooler 21e so that the detection value of the thermometer 22c (cooling device 20 outlet temperature) becomes the first preset temperature. As a result, the cooling gas 3d at the temperature required for the treatment can be supplied to the substrate 100.

(With Respect to Failure of Cooling Device)

Here, in the embodiment, between the treatments of the substrate 100, it is not necessary to supply the cooling gas 3d to the substrate treatment device 1 in the substrate carry-in/carry-out process. Further, it is not necessary to supply the cooling gas 3d to the substrate treatment device 1 even in the process that does not require cooling, and in the thawing/drying process in the embodiment. Therefore, if the same amount of the cooling gas 3d as the amount of the cooling gas 3d in the treatment of the substrate 100 is supplied to the substrate treatment device 1 between the treatments of the object and during the treatment which does not require cooling, this leads to an increase in the amount of cooling gas 3d.

Further, when the substrate 100 is carried in and out, the position of the substrate 100 may shift due to the supplied cooling gas 3d, and the substrate 100 may not be held. Further, in the thawing/drying of the substrate 100, if the cooling with the cooling gas 3d continues, the thawing/drying time may increase.

Therefore, between the treatments of the substrate 100 or in the treatment that does not require cooling of the substrate 100, the supply of the cooling gas 3d is stopped or the supply amount of the gas is reduced to reduce the amount of the cooling gas 3d consumed. However, if the supply of the low-temperature gas is stopped or the supply amount is reduced between the treatments of the substrate 100 or in the treatment that does not require cooling of the substrate 100, failure of the cooling device 20 occurs frequently.

As a result of the study, the inventor obtained the following findings. First, it was found that when the supply of the cooling gas 3d was stopped or the supply amount was reduced, the temperature of the cooling gas 3d supply system (for example, the gas cooling part 22 and the cooling gas supplier 3) increased. It was also found that the refrigerant L may coagulate as the temperature of the supply system of the cooling gas 3d rises.

The supply system of the cooling gas 3d is in contact with the surrounding air. Therefore, the supply system of the cooling gas 3d receives heat from the surrounding air. On the other hand, when the cooling gas 3d is flowing inside the supply system of the cooling gas 3d, heat conduction occurs between the cooling gas 3d and the supply system of the cooling gas 3d. Therefore, the supply system of the cooling gas 3d also receives heat from the cooling gas 3d.

When the temperature of the cooling gas 3d is sufficiently lower than the temperature of the surrounding air, the temperature of the supply system of the cooling gas 3d and the temperature of the cooling gas 3d are substantially the same value. Therefore, even when the thermometer 22c detects the temperature of the supply system of the cooling gas 3d, the detection value can be regarded as the temperature of the cooling gas 3d. Therefore, if the controller 24 controls the cooler 21e so that the detection value of the thermometer 22c becomes the first preset temperature, the temperature of the cooling gas 3d supplied to the substrate 100 can be the value within the target range including the first preset temperature.

That is, the controller 24 may execute a first control method of adjusting the temperature of the refrigerant L so that the detection value of the thermometer 22c is within the target range (first preset temperature).

However, when the cooling gas 3d does not flow inside the supply system of the cooling gas 3d, heat conduction does not occur between the supply system of the cooling gas 3d and the cooling gas 3d. Therefore, the supply system of the cooling gas 3d does not receive heat from the cooling gas 3d, but receives heat only from the surrounding air. Therefore, the temperature of the supply system of the cooling gas 3d rises with respect to the case where the cooling gas 3d flows inside the supply system of the cooling gas 3d. Finally, the temperature of the supply system of the cooling gas 3d becomes substantially the same as the temperature of the surrounding air.

As described above, when the cooling gas 3d does not flow inside the supply system of the cooling gas 3d, the detection value of the thermometer 22c is not the temperature of the cooling gas 3d but the temperature of the supply system of the cooling gas 3d. This is the same even when the temperature of the cooling gas 3d is directly detected. Then, the detection value of the thermometer 22c maintains a temperature higher than the first preset temperature which is the target temperature of the cooling gas 3d at the treatment of the substrate 100. Therefore, when the controller 24 executes the first control method based on the detection value of the thermometer 22c, the detection value of the thermometer 22c actually indicates the temperature of the supply system of the cooling gas 3d, so that the refrigerant L is only cooled. When the refrigerant L is cooled, the temperature of the refrigerant L becomes lower.

However, even if the temperature of the refrigerant L is lowered, the detection value of the thermometer 22c hardly changes. Therefore, the controller 24 controls the cooler 21e in order to further lower the temperature of the refrigerant L.

If the temperature of the liquid refrigerant L becomes too low, the liquid refrigerant L tends to coagulate. When the liquid refrigerant L coagulates, the piping through which the refrigerant L circulates may be clogged. If the piping through which the refrigerant L circulates is clogged, the compressor 21a or the like that circulates the refrigerant L may fail. In addition, each unit provided in the flow path through which the refrigerant L flows, such as the condenser 21c and the heat exchanger 21f, may also fail. The state in which the refrigerant L coagulates includes a state in which a part of the refrigerant. L coagulates.

The controller 24 controls the cooler 21e to cool the refrigerant L more than necessary even when a small amount of the cooling gas 3d is flowing inside the supply system of the cooling gas 3d. The cooling gas 3d flowing inside the supply system of the cooling gas 3d absorbs heat from the supply system of the cooling gas 3d. As the flow rate of the cooling gas 3d decreases, the heat received by the cooling gas 3d per unit flow rate from the supply system of the cooling gas 3d increases. As the amount of heat received by the cooling gas 3d increases, the amount of temperature increase of the cooling gas 3d also increases. That is, the smaller the flow rate of the cooling gas 3d, the larger the amount of temperature increase of the cooling gas 3d.

If the amount of temperature increase of the cooling gas 3d becomes too large, the temperature range of the first preset temperature may be exceeded. Therefore, it is necessary to consider not only the case where the supply of the cooling gas 3d is stopped but also the case where the supply amount of the cooling gas 3d is small.

Here, a method of providing a heat insulating member in the cooling gas supply system to prevent the cooling gas supply system from receiving heat from the surrounding air can be considered. However, even if the heat insulating member is provided in the cooling gas supply system, it is not possible to completely prevent the heat from being received from the surrounding air.

Based on the above findings, the inventor has set a threshold value in advance for the supply amount of the cooling gas 3d in order to prevent the failure of the cooling device 20. When the supply amount of the cooling gas 3d is equal to or less than the threshold value, the controller 24 switches the control to a second control method for controlling the device 21e so that the temperature of the refrigerant L is within the temperature range including the second preset temperature based on the detection value of the thermometer 21h.

The second control method is a control method that the temperature of the refrigerant L is adjusted based on the temperature of the refrigerant L immediately before entering the heat exchanger so that the temperature of the refrigerant L becomes the second preset temperature set in the temperature range in which the refrigerant L does not coagulate. When the controller 24 switches from the first control method to the second control method, the object for temperature control is switched from the cooling gas 3d to the refrigerant L. For example, when the cooling gas 3d is not flowing or only a small amount is flowing inside the supply system of the cooling gas 3d, and the controller 24 cools the refrigerant L based on the detection value of the thermometer 22c, the controller 24 excessively cools the refrigerant L in an attempt to change the detection value of the thermometer 22c that does not change or does not change easily. By performing the above switching by the controller 24, the refrigerant. L is not excessively cooled. Therefore, the refrigerant L does not coagulate and the cooling device 20 does not fail.

That is, even if the controller 24 executes the first control method of adjusting the temperature of the refrigerant L so that the detection value becomes the temperature within the target range based on the detection value of the thermometer 22c, when the detection value of the thermometer 22c cannot be adjusted within the target range, the target for temperature control can be switched by switching to the second control method. Therefore, there is no case where the cooling device 20 fails by excessively cooling the refrigerant L in an attempt to change the detection value of the thermometer 22c which does not change or does not change easily, and occurrence of coagulation of the refrigerant L.

Here, the threshold value, which is a predetermined value, is a value for preventing the failure of the cooling device 20 as described above. Specifically, it is a reference value for switching from the first control method to the second control method. In the embodiment, the threshold value is the supply amount of the cooling gas 3d in the case where the cooling gas 3d receives heat from the supply system of the cooling gas 3d and the temperature rises, and the increased temperature of the cooling gas 3d is within the range of the first preset temperature. For example, the threshold is 30 NL/min.

The threshold value differs depending on the pipe diameter and the pipe length of the gas cooling part 22 and the cooling gas supplier 3. The threshold value may be obtained by experiment in advance. For example, the cooling gas 3d is supplied in a sufficiently large supply amount, and the detection value of the thermometer 22c is set to be within the temperature range of the first preset temperature. Next, the supply amount of the cooling gas 3d may be gradually reduced, and the supply amount when the detection value of the thermometer 22c deviates from the temperature range of the first preset temperature may be set as the threshold value.

The second preset temperature is a temperature range in which the refrigerant L does not coagulate. The second preset temperature may also be obtained by experiment in advance. For example, the temperature at which the refrigerant L coagulates may be determined by cooling the refrigerant L using a known cascade capacitor and set to a temperature range higher than that temperature. The second preset temperature may be such that the occurrence of failure of the cooling device 20 can be suppressed. For example, the refrigerant L may be partially coagulated. The temperature in such a case can also be included in the temperature range.

Next, the operation of the cooling device 20 in the substrate treatment device 1 will be illustrated.

In the freezing process, the controller 24 of the cooling device 20 obtains data (for example, 150 NL/min) of the supply amount of the cooling gas 3d from the command of the controller 10 of the substrate treatment device 1. The controller 24 determines whether or not the supply amount of the obtained cooling gas 3d is equal to or greater than the threshold value. When the threshold value is set to 30 NL/min, the supply amount of the cooling gas 3d is equal to or higher than the threshold value. The controller 24 controls the cooler 21e based on the detection value from the thermometer 22c provided at the discharge port 22e of the cooling device 20, and the temperature of the cooling gas 3d is adjusted so that the temperature difference between the detection value from the thermometer 22c and the first preset temperature is within the allowable range (first control method).

Therefore, since the temperature of the cooling gas 3d is controlled by the thermometer 22c, it is possible to reduce the variation in the temperature of the cooling gas 3d while it is being supplied to the substrate 100. As a result, the temperature of the substrate 100, and by extension, the temperature of the liquid 101 on the substrate 100 can be controlled with high accuracy. Further, even if the substrate 100 is replaced, the reproducibility of the cooling process can be improved.

Similar to the freezing process, in the thawing/drying process, the controller 24 obtains data (stop: 0 NL/min) of the supply amount of the cooling gas from the command of the controller 10. Then, the controller 24 determines whether or not the supply amount of the cooling gas is equal to or greater than the threshold value. When the threshold value is set to 30 NL/min, the supply amount of the cooling gas 3d is less than the threshold value. Based on the determination result, the controller 24 switches from the above-mentioned first control method (control using the thermometer 22c) to the second control method for controlling the cooler 21e based on the detection value from the thermometer 21h. The controller 24 adjusts the temperature of the refrigerant L so that the difference between the detection value from the thermometer 21h and the second preset temperature is within the allowable range.

When the supply amount of the cooling gas 3d is less than the threshold value, the controller 24 of the cooling device 20 performs the second control method, so that the refrigerant L can be suppressed from coagulating. As a result, the amount of wastefully consumed gas can be suppressed, and the occurrence of failure of the cooling device can be suppressed.

In the substrate carry-in/carry-out process that follows the thawing/drying process, the controller 10 has not issued a new command regarding the supply amount of the cooling gas 3d. Therefore, the controller 24 controls the flow rate controller 22b to maintain the supply stop of the cooling gas 3d. Further, the controller 24 controls the cooler 21e so that the temperature of the refrigerant L flowing through the circulation part 21 of the cooling device 20 becomes the second preset temperature. That is, the controller 24 continues to perform the second control method after the thawing/drying process.

In the substrate treatment device 1 of the embodiment, the temperature of the discharge portion of the cooling gas 3d becomes high during the thawing/drying process and the substrate carry-in/carry-out process in which the supply of the cooling gas 3d is stopped or the supply amount is reduced. Therefore, in the thawing/drying process and the substrate carry-in/carry-out process, when the controller 24 controls the operation of the cooling device 20 in order to lower the temperature of the cooling gas 3d to the first preset temperature as in the conventional case based on the temperature at the discharge portion of the cooling gas 3d, the failure of the cooling device 20 occurred frequently.

Therefore, the substrate treatment device 1 of the embodiment includes the flow path through which the refrigerant L can flow, the condenser 21c provided in the flow path, the heat exchanger 21f provided in the flow path, the compressor 21a provided in the flow path between the condenser 21c and the heat exchanger 21f, the cooler 21e for cooling the refrigerant L flowing into the heat exchanger 21f from the condenser 21c, the gas cooling part 22 which supplies the gas to the heat exchanger 21f, and can cool the gas by heat exchange with the heat exchanger 21f, the thermometer 22c which can detect the temperature of the cooled gas, the thermometer 21h which can detect the temperature of the refrigerant L flowing into the heat exchanger 21f, and the controller 24 which can adjust the temperature of the refrigerant L to be cooled flowing into the heat exchanger by controlling the cooler 21e. The controller 24 includes the cooling device 20 which can control the temperature of the refrigerant L flowing into the heat exchanger 21f by switching a first control that controls based on the temperature detected by the thermometer 22c and a second control that controls based on the temperature detected by the thermometer 21h.

In the freezing process, the substrate treatment device 1 provided with the cooling device 20 can execute the first control method that adjusts the temperature of the cooling gas 3d so that the difference between the detection value from the thermometer 22c and the first preset temperature is within an allowable range. Then, in the thawing/drying process and the substrate carry-in/carry-out process, the substrate treatment device 1 can execute the second control method that adjusts the temperature of the refrigerant L so that the difference between the detection value from the hygrometer 21h and the second preset temperature is within the allowable range.

When a process performed by cooling the substrate 100, for example, a freezing treatment process is continuously performed, the temperature difference of the cooling gas 3d supplied for each process can be reduced by executing the first control method. Therefore, the difference in the removal ratio for each substrate 100 can also be reduced. Further, it is possible to prevent the refrigerant L from coagulating by executing the second control method during the treatment that does not require cooling or between the treatments of the substrate 100, for example, in the thawing/drying treatment process and the substrate carry-in/carry-out process. Therefore, it is possible to suppress the failure of the cooling device 20 due to the clogging of the piping and the consumption amount of gas.

In the substrate treatment device 1 of the embodiment, the supply of the cooling gas 3d was stopped in the substrate carry-in/carry-out process. However, if there is no effect on the carrying-in and carrying-out of the substrate 100, the supply amount of the cooling gas 3d may be supplied in an amount equal to or more than the threshold value and smaller than the value required for the treatment. By doing so, it is possible to keep the supply system of the cooling gas 3d cooler than the ambient temperature. By keeping the supply system of the cooling gas 3d cold, when the cooling gas supplier 3 supplies the cooling gas 3d to treat the next substrate 100, the time required for the cooling gas 3d to be cooled to the first preset temperature is will be shortened. Therefore, the operating rate of the substrate treatment device 1 can be improved.

As described above, the cooling method according to the embodiment of the invention is a cooling method in which the refrigerant L is evaporated and the gas is cooled by heat exchange with the supplied gas. The cooling method according to the embodiment of the invention controls the temperature of the refrigerant L based on the temperature of the cooled gas when the flow rate of the supplied gas is equal to or higher than a predetermined value. When the flow rate of the supplied gas is less than a predetermined value, the temperature of the refrigerant L is controlled based on the temperature of the refrigerant L before evaporation. By doing so, it is possible to suppress the coagulation of the liquid refrigerant L. Therefore, it is possible to suppress the occurrence of the failure of the cooling device 20 due to the clogging of the piping and the consumption amount of gas.

Second Embodiment

Next, as another example, a cooling device that can be used for etching the substrate will be described.

Figure 4:
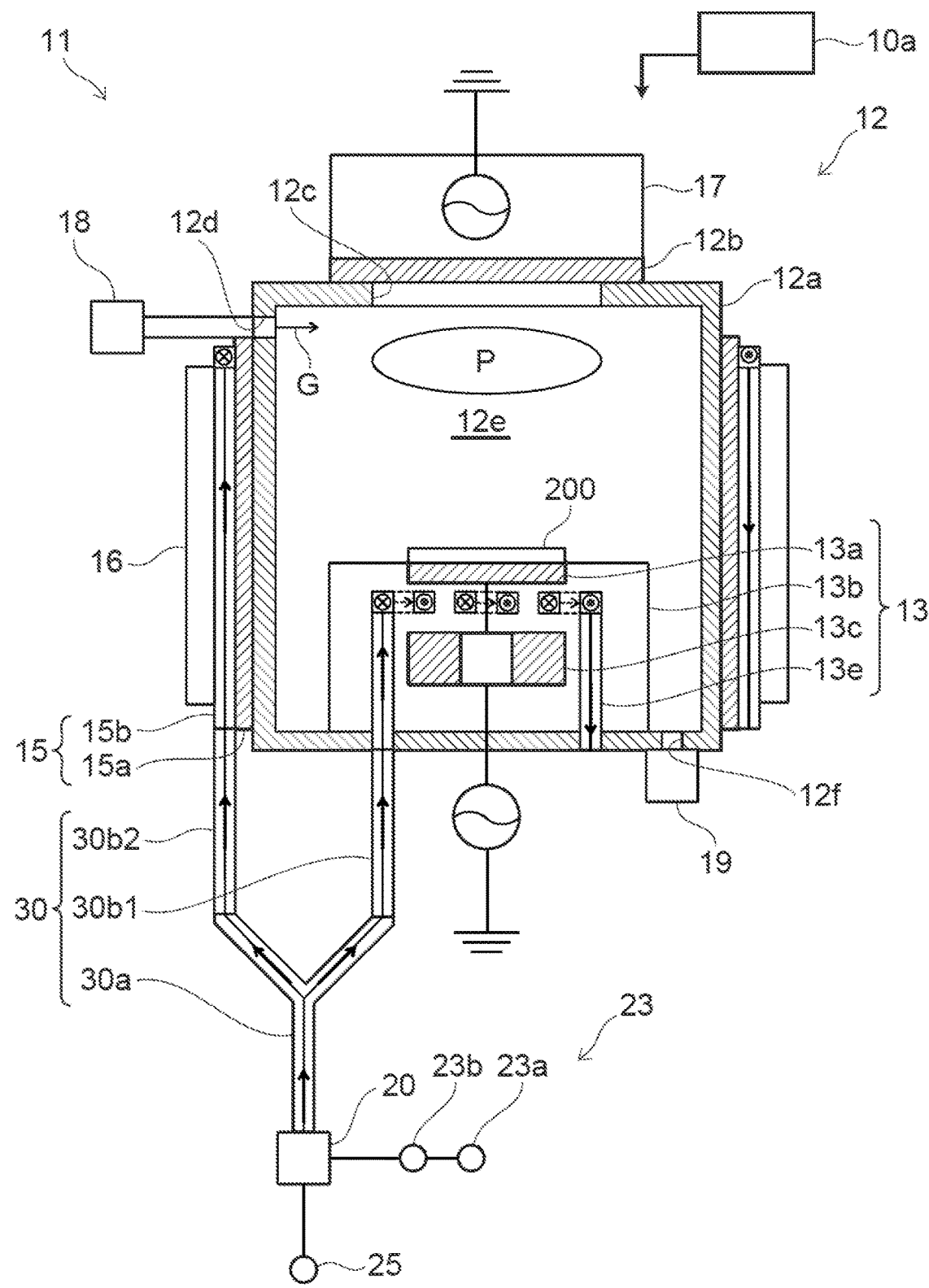
FIG. 4 is a schematic view for illustrating other substrate treatment device including the cooling device according to the embodiment.

FIG. 4 is a schematic view for illustrating a substrate treatment device 11 provided with the cooling device 20 according to the embodiment. The substrate treatment device 11 is a substrate treatment device that can be used for manufacturing a fine structure such as an electronic component. Specifically, it is a device for etching a semiconductor substrate with plasma.

(Substrate)

Figure 5A:
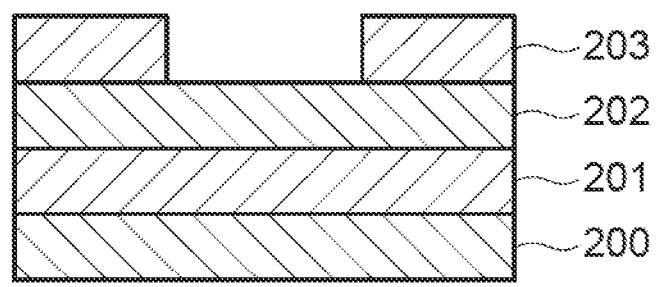
FIGS. 5A and 5B are schematic views for illustrating a structure of the substrate to be treated in the other substrate treatment device.
Figure 5B:
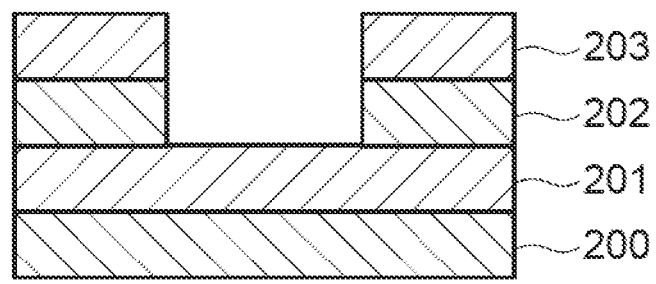

FIGS. 5A and 5B are schematic views for illustrating a structure of a substrate 200 to be treated by the substrate treatment device 11. An interconnect layer 201 with metal interconnect is formed on the substrate 200. An insulating film 202 such as SiC); is formed on the interconnect layer 201. A resist pattern 203 is formed on the insulating film 202. The substrate 200 on which the resist pattern 203 is formed is also referred to as a substrate 200. The application of the substrate 200 is not limited to this, and the substrate corresponding to the substrate 100 of the first embodiment can also be applied. As shown in FIG. 4, the substrate treatment device 11 can be provided with a chamber 12, a placement part 13, a cooling gas supplier 30, a cooling member 15, a heating device 16, a power supply part 17, a plasma forming gas supplier 18, and a decompression part 19, a controller 10a (corresponding to an example of the second controller), and the cooling device 20.

The chamber 12 is a container possible to maintain an atmosphere depressurized from atmospheric pressure. A region 12e where plasma P is generated is provided inside the chamber 12. The chamber 12 includes a main body 12a and a window 12b. The main body 12a has a cylindrical shape having an opening 12c at one end and the other end is closed. The closed other end becomes the bottom surface of the chamber 12. The main body 12a is formed of a conductive material such as aluminum.

A gas supply port 12d for supplying the gas G for plasma generation is provided on the side surface of the main body 12a near the opening 12c. Further, an exhaust port 12f for discharging the gas inside the chamber 12 is provided at the closed other end of the main body 12a.

The window 12b is provided in the opening 12c via a seal member (not shown). The window 12b is formed of an insulating material such as quartz.

The placement part 13 is provided inside the chamber 12 and on the bottom surface of the chamber 12. The placement part 13 includes an electrode 13a, a pedestal 13b, a heating part 13c, and a power supply (not shown).

The electrode 13a can be provided below the region 12e where the plasma P is generated. The substrate 200 can be placed on the upper surface of the electrode 13a.

The pedestal 13b can be provided between the electrode 13a and the bottom surface of the chamber 12. The pedestal 13b can be provided to insulate between the electrode 13a and the chamber 12. The heating part 13c and the cooling part 13e can be provided inside the pedestal 13b.

The heating part 13c can heat the substrate 200 via the electrode 13a. The heating part 13c may be, for example, one that utilizes Joule heat, one that circulates a thermal medium, one that radiates infrared rays, or the like.

The cooling part 13e is a flow path through which the cooling gas 3d flows. For example, it is formed on the pedestal 13b. One end of the cooling part 13e is connected to the cooling gas supplier 30 (piping 30b1) described later. The other end of the cooling part 13e is connected to the outside of the substrate treatment device 11. As a result, the cooling gas 3d supplied from the cooling device 20 passes through the piping and is discharged to the outside of the device. The cooling part 13e can cool the substrate 200 via the electrode 13a.

The cooling gas supplier 30 connects the chamber 12 (main body 12a) and the placement part 13 to the cooling device 20. The cooling gas 3d flows inside the cooling gas supplier 30. In the embodiment, the cooling gas supplier 30 includes a connection part 30a, a piping 30b1, and a piping 30b2.

The connection part 30a is a piping having a branch.

One end of the connecting part 30a is connected to the cooling device 20 described later. The branched other ends of the connection part 30a are connected to the piping 30b1 and the piping 30b2, respectively.

The piping 30b1 is connected to the cooling part 13e of the placement part 13 described above. The piping 30b2 is connected to the cooling member 15 described later. The piping 30b1 and 30b2 are provided with valves (not shown) that control the supply and stop of the cooling gas 3d, respectively.

The cooling member 15 and the heating device 16 can be provided on the side surface of the chamber 12. The cooling member 15 can cool the main body 12a. The cooling member 15 includes, for example, a main body 15a and a piping 15b.

The main body 15a covers the side surface of the chamber 12. The main body 15a may be made of a material having good thermal conductivity, for example, a thin metal plate.

The piping 15b is provided on the surface of the main body 15a opposite to the surface in contact with the chamber 12. The piping 15b has a structure in which one piping is bent along the surface or the inside of the main body 15a. One end of the piping 15b is connected to the piping 30b2, and the other end is provided outside the chamber 12. As a result, the cooling gas 3d supplied from the cooling device 20 passes through the piping and is discharged to the outside of the device. The cooling gas 3d flows inside the piping 15b to cool the piping 15b. As a result, the side surface of the chamber 12 is cooled via the main body 15a.

The heating device 16 heats the chamber 12 via the cooling member 15. The heating device 16 is provided on the outer periphery of the cooling member 15, for example. The heating device 16 may be, for example, one that utilizes Joule heat, one that circulates a heat medium, one that radiates infrared rays, or the like.

The power supply part 17 is provided in the upper part of the chamber 12. The power supply part 17 serves as a plasma generator that generates the plasma P inside the chamber 12. For the power supply part 17, for example, a known ICP plasma source can be used.

The plasma forming gas supplier 18 can supply the gas G to the region 12e where the plasma P is generated inside the chamber 12 via the gas supply port 12d.

The decompression part 19 can reduce the pressure so that the inside of the chamber 12 has a pressure required for treating the substrate 200. The decompression part 19 can be, for example, a turbo molecular pump or the like. The decompression part 19 is connected to the exhaust port 12f provided in the main body 12a via a piping (not shown).

The controller 10a can have the same configuration as the controller 10. The controller 10a can control the operation of each element provided in the substrate treatment device 11. For example, the controller 10a controls a power supply (not shown) to apply high frequency power to the electrodes 13a and the power supply part 17.

The controller 10a controls the heating part 13c, the cooling device 20, and the cooling gas supplier 30 to control the temperature of the substrate 200 placed on the electrode 13a. Further, the controller 10a controls the heating device 16, the cooling device 20, and the cooling gas supplier 30 to control the temperature of the chamber 12.

The controller 10a controls the plasma forming gas supplier 18 to control the supply and stop of the gas G to the chamber 12. Further, the controller 10a controls the supply amount of the gas G to control the pressure in the chamber 12. The controller 10a stores in advance the time for cooling the chamber 12 with the cooling member 15. The cooling time may be determined in advance by an experiment.

Next, etching of the substrate 200 by RIE (reactive ion etching), for example, using the substrate treatment device 11 will be described. The insulating film 202 of the substrate 200 is etched using the resist pattern 203 as a mask to form a groove.

First, the substrate 200 is carried into the chamber 12 and the chamber 12 is sealed. After that, the inside of the chamber 12 is depressurized by the decompression part 19. When a predetermined pressure is reached, the gas G, which is a reactive gas, is supplied into the chamber 12 from the plasma forming gas supplier 18. Next, a high frequency voltage is applied to the power supply part 17 to generate plasma.

The insulating film 202 of the substrate 200 is etched by ions and radicals generated in the plasma. At this time, a reaction product is produced by the reaction between the gas G and the substrate 200.

When etching the insulating film 202 in order to change the production state of the reaction product generated during the etching process, the placement part 13 and/or the chamber 12 are cooled by the cooling part 13e and/or the cooling member 15. Alternatively, the placement part 13 and/or the chamber 12 are heated by the heating part 13c and/or the heating device 16.

The amount of reaction product generated varies depending on the temperature of the substrate 200. Heating the substrate 200 accelerates the reaction and increases the reaction products. The generated reaction product adheres to the substrate 200 and the inner wall of the chamber 12. The amount of the reaction product adhered varies depending on the temperature of the substrate 200 and the inner wall of the chamber 12. The higher the temperature of the substrate 200 and the inner wall of the chamber 12, the less likely it is to adhere.

The reaction product serves as a side wall protective film that protects the side wall of the groove formed in the insulating film 202 by etching. Thereby, the etching shape can be controlled. Therefore, in order to attach the reaction product to the wall portion of the groove, the temperature of the placement part 13 is controlled to cool the substrate 200. An example of temperature control is described below.

For example, the placement part 13 is cooled to −30° C. before etching the insulating film 202. The controller 10a issues a command to supply the cooling gas 3d to the controller 24 of the cooling device 20. The controller 24 controls the flow rate controller 22b to supply the cooling gas 3d to the gas cooling part 22. The controller 24 obtains data (for example, 100 NL/min) of the supply amount of the cooling gas 3d from the command of the controller 10 of the substrate treatment device 1. Then, the controller 24 compares the supply amount of the cooling gas 3d with the threshold value. As a result, it is determined whether or not the supply amount of the cooling gas 3d is equal to or higher than the threshold value. When the threshold value is set to 30 NL/min, the supply amount of the cooling gas 3d is larger than the threshold value. Therefore, the controller 24 controls the cooler 21e so that the temperature of the cooling gas 3d becomes −30° C. (first preset temperature) based on the signal of the thermometer 22c.

While the placement part 13 is cooled, the controller 10a controls the heating device 16 to heat the chamber 12 in order to prevent the reaction products from adhering to the inner wall of the chamber 12 which causes particles. In this case, the valve (not shown) of the piping 30b2 is closed. By closing the valve (not shown), the cooling gas 3d does not flow inside the piping 30b2. Since the other end of the piping 15b is connected to the outside of the chamber 12, the cooling gas 3d inside the piping 15b is discharged to the outside of the chamber 12. As a result, it is possible to prevent the cooling member 15 from hindering the heating of the heating device 16.

Next, after etching the insulating film 202, the controller 10a controls the heating part 13c to heat the placement part 13 to room temperature. If the cooled substrate 200 comes into contact with the air in the atmosphere, dew condensation may occur. If dew condensation occurs, there is a risk that watermarks will be formed or particles will adhere to the substrate 200 and the substrate 200 will be defective. By heating the placement part 13 to room temperature, the temperature of the substrate 200 is set to room temperature, and dew condensation is prevented. Further, if a transfer arm or the like that conveys the substrate 200 is put into the chamber when the chamber is at a high temperature, the transfer arm may be deformed by heat. In order to prevent such transfer trouble, the chamber 12 is cooled and returned to room temperature. In this case, the valve (not shown) of the piping 30b1 is closed, and the valve (not shown) of the piping 30b2 is opened.

In this case, no new command is issued from the controller 10a to the controller 24. Therefore, the controller 24 continues to supply the cooled cooling gas 3d at 100 L/min by controlling the flow rate controller 22b. Further, the cooler 21e is controlled so that the temperature of the cooling gas 3d becomes −30° C. based on the signal of the thermometer 22c.

(First Control Method)

The controller 10a issues a command to the controller 24 to stop the supply of the cooling gas 3d when the time for cooling the chamber 12 by the cooling member 15 stored in advance has elapsed.

Upon receiving the command, the controller 24 controls the flow rate controller 22b and stops the supply of the cooling gas 3d. Further, the controller 24 acquires information on the supply amount of the cooling gas 3d from the signal of the command to stop the supply of the cooling gas 3d, and compares the supply amount of the cooling gas 3d with the threshold value. In this case, the supply amount of the cooling gas 3d is zero, which is smaller than the threshold value. Therefore, the controller 24 controls the cooler 21e so that the temperature of the refrigerant L becomes the second preset temperature, which is the temperature range in which the refrigerant L does not coagulate, based on the signal of the thermometer 21h. (Second control method)

When the temperatures of the substrate 200 and the chamber 12 reach the room temperature, the substrate 200 is carried out and the untreated substrate 200 is carried in. During this period, no new command has been issued regarding the supply amount of the cooling gas 3d by the controller 10a. Therefore, the controller 24 continues to control the cooler 21e so that the temperature of the refrigerant L becomes the second preset temperature based on the signal of the thermometer 21h.

When treating the substrate 200, the temperature of the substrate 200 and the chamber 12 is adjusted by using a heating means or a cooling means. When the cooling device 20 is applied to the substrate treatment device 11, cooling is not required when the substrate 200 or the chamber 12 is being heated and when the substrate 200 is taken in and out.

Therefore, the controller 24 stops the supply of the cooling gas 3d in order to stop the cooling of the substrate 200 or the chamber 12. In order to adjust the temperature of the chamber 12 and the placement part 13 to a temperature suitable for treatment, the controller 24 measures the temperature of the cooling gas 3d supplied to the chamber 12 and the placement part 13. Then, the controller 24 controls the cooling device 20 so that the temperature is within the required temperature range.

When the supply of the cooling gas 3d to the chamber 12 and the placement part 13 is stopped, the temperature of the chamber 12 and the temperature of the placement part 13 rise. Therefore, when the temperature of the cooling gas 3d supplied to the chamber 12 and the placement part 13 whose temperatures are measured becomes higher than the target range, the cooling device 20 tries to lower the temperature of the cooling gas 3d to be supplied. Since the supply of the cooling gas 3d is stopped, the temperature of the supplied cooling gas 3d does not return to the target range. Therefore, the temperature of the cooling gas 3d is excessively lowered, and the cooling device 20 is damaged.

In the above embodiment, when the supply amount of the cooling gas 3d falls below the threshold value because the cooling gas 3d supplied to the chamber 12 and the placement part 13 is stopped, the controller 24 switches from the first control method to the second control method. As a result, even if the supply of the cooling gas 3d to the chamber 12 and the placement part 13 is stopped, the cooling device 20 does not operate to excessively lower the temperature of the cooling gas 3d. Therefore, the cooling device 20 is not damaged. As for the temperature of the refrigerant L, it is preferable to detect the temperature after being cooled by the cooler 21e. The first control method is to control the cooling device 20 so as to adjust the temperature of the cooling gas 3d supplied to the chamber 12 and the placement part 13 to the target range. The second control method is to adjust the temperature of the refrigerant L before being supplied to the heat exchanger 21f of the cooling device 20 to the second target range (second set value).

Although etching has been described in the embodiment, the substrate treatment device 11 of the embodiment can also be used for aching and film formation using plasma.

In the above-described embodiment, the application of the cooling device according to the invention to the substrate treatment device that performs the substrate cleaning treatment and the etching treatment is described, but the devices to which the cooling device according to the invention is applied are not limited to these. It is possible to apply to cases where there is a process that does not require cooling, such as a cleaning treatment, and where there is a process in which cooling is performed intermittently, such as when heating and cooling are repeated such as an etching treatment, and to the applicable devices.

For example, a batch type oven and a firing furnace or the like is exemplified, in which although the object to be processed being heat-treated, cooling is not performed in the heat treatment and cooling is performed when the object to be processed is replaced.

The embodiments have been illustrated above. However, the invention is not limited to these descriptions.

Any addition, deletion, or design change of components, or any addition, omission, or condition change of processes in the above embodiments suitably made by those skilled in the art are also encompassed within the scope of the invention as long as they fall within the spirit of the invention.

For example, the shape, the dimension, the number, the disposition or the like of the components included in the substrate treatment device 1 and the substrate treatment device 11 are not limited to the illustration and can be appropriately modified.

For example, in the above-described embodiment, the operation of the cooling device 20 is controlled based on a signal from the thermometer 22c provided at the discharge port 22e of the gas cooling part 22. However, it is not limited to this. For example, the operation of the cooling device 20 may be controlled based on a signal from the thermometer 3e provided on the cooling nozzle 3c of the cooling gas supplier in the substrate treatment device 1.

The detection value of the thermometer 3e corresponds to the outlet temperature of the nozzle 3c. Therefore, by using the signal from the thermometer 3e, the difference between the temperature of the cooling gas 3d supplied to the surface of the substrate 100 on the placement part 2 side and the temperature of the cooling gas 3d detected by the thermometer 3e can be reduced. As a result, the temperature of the substrate 100, and by extension, the temperature of the liquid 101 on the substrate 100 can be controlled more accurately. Therefore, the reproducibility of the treatment of the substrate 100 can be improved.

Of course, even if a thermometer for measuring the temperature of the placement part 13 and the chamber 12 in the substrate treatment device 11 is provided, it can be handled in the same manner as the thermometer 3e. Even in this case, the temperature of the substrate 200 and the temperature of the chamber 12 can be controlled accurately. Therefore, the reproducibility of the treatment of the substrate 200 can be improved.

Further, in the above-described embodiment, the flow rate controller 22b is provided inside the cooling device. However, it is not limited to this. For example, it may be provided between the gas supplier 25 and the cooling device 20. Alternatively, it may be provided between the cooling device 20 and the cooling gas supplier 3. Further, it may be provided inside the substrate treatment device.

Further, the controller 10 or the controller 10a may control the flow rate controller 22b. When the controller 10 or the controller 10a controls the flow rate controller 22b, the controller 10 does not issue a command to the controller 24.

The controller 24 may acquire a signal from the flow rate controller 22b and acquire information on the supply amount of the cooling gas 3d.

Further, in the above-described embodiment, the substrate treatment device and the cooling device are each provided with a controller. However, it is not limited to this. For example, only the controller on the substrate treatment side may be provided, and this controller may also control the operation of the cooling device.

Further, in the above-described embodiment, the switching between the first control method and the second control method is performed based on the command for supplying the cooling gas 3d issued by the control device 10. However, the supply system of the cooling gas 3d may be provided with a flowmeter for detecting the flow rate of the cooling gas 3d, and the switching may be performed based on the actual flow rate of the cooling gas 3d based on the detection value of the flow meter. In this case, even if an unintended decrease in the flow rate occurs due to a gas leak or the like, it can be dealt with.

Further, by comparing the detection value of the thermometer 22c with the first preset temperature, it may be determined whether the control of the cooling device 20 is based on the first control method or the second control method. In this case, the threshold value is not the supply state and supply amount of the cooling gas 3d, but is about the temperature of the cooling gas 3d.

Further, in the above-described embodiment, the cooling device supplies the cooling gas to the substrate treatment device, but a cooling liquid may be used instead of the cooling gas.

What is claimed is:

1. A cooling device, comprising:
   a flow path configured to flow a refrigerant:
   a condenser provided in the flow path:
   a heat exchanger provided in the flow path:
   a compressor provided in the flow path between the condenser and the heat exchanger:
   a cooler cooling the refrigerant flowing from the condenser into the heat exchanger:
   a gas cooling part supplying a gas to the heat exchanger:
   the heat exchanger configured to cool the gas by exchanging heat exchange between the refrigerant and the gas,
   a first thermometer configured to detect a temperature of the cooled gas by the gas cooling part:
   a second thermometer configured to detect a temperature of the refrigerant flowing into the heat exchanger: and
   a first controller configured to control the temperature of the cooled refrigerant by the cooler, the refrigerant flowing into the heat exchanger,
   the first controller controlling the temperature of the cooled refrigerant flowing into the heat exchanger by switching a first control and a second control, the first control being based on the temperature detected by the first thermometer, the second control being based on the temperature detected by the second thermometer,
   the first controller performs
      the first control when a flow rate of the gas supplied to the heat exchanger is equal to a predetermined value or more, and
      the second control when a flow rate of the gas supplied to the heat exchanger is less than a predetermined value.

2. The cooling device according to claim 1, wherein the condenser coagulates the gaseous refrigerant sent from the compressor.

3. The cooling device according to claim 2, wherein the cooler includes at least one of an evaporator, a cascade condenser, or a structure in which the evaporator or the cascade capacitor is combined in multiple stages.

4. The cooling device according to claim 3, wherein the cooler further includes at least one of an expansion valve expanding the refrigerant or a capillary tube.

5. The cooling device according to claim 4, further comprising:
   a flow rate controller controlling the flow rate of the gas supplied to the heat exchanger.

6. A substrate treatment device, comprising:
   the cooling device according to claim 1;
   a placement part configured to place a substrate and rotate;
   a liquid supplier configured to supply a liquid to a surface of the substrate, the surface being cleaned;
   a cooling gas supplier configured to supply a gas to a surface of the substrate on a side of the placement part, the gas being cooled by the cooling device; and
   a second controller configured to control a rotation speed of the substrate, a supply amount of the liquid, and a first controller of the cooling device.

7. The substrate treatment device according to claim 6, wherein
   the cooling gas supplier includes a cooling nozzle supplying the cooled gas to the surface of the substrate, and
   a first thermometer of the cooling device is provided at a discharge port of the cooling nozzle.

8. A substrate treatment device, comprising:
   the cooling device according to claim 2;
   a placement part configured to place a substrate and rotate;
   a liquid supplier configured to supply a liquid to a surface of the substrate, the surface being cleaned;
   a cooling gas supplier configured to supply a gas to a surface of the substrate on a side of the placement part, the gas being cooled by the cooling device; and
   a second controller configured to control a rotation speed of the substrate, a supply amount of the liquid, and a first controller of the cooling device.

9. The substrate treatment device according to claim 8, wherein
   the cooling gas supplier includes a cooling nozzle supplying the cooled gas to the surface of the substrate, and
   a first thermometer of the cooling device is provided at a discharge port of the cooling nozzle.

10. A substrate treatment device, comprising:
    the cooling device according to claim 3;
    a placement part configured to place a substrate and rotate;
    a liquid supplier configured to supply a liquid to a surface of the substrate, the surface being cleaned;
    a cooling gas supplier configured to supply a gas to a surface of the substrate on a side of the placement part, the gas being cooled by the cooling device; and
    a second controller configured to control a rotation speed of the substrate, a supply amount of the liquid, and a first controller of the cooling device.

11. The substrate treatment device according to claim 10, wherein
    the cooling gas supplier includes a cooling nozzle supplying the cooled gas to the surface of the substrate, and
    a first thermometer of the cooling device is provided at a discharge port of the cooling nozzle.

12. A substrate treatment device, comprising:
    the cooling device according to claim 4;
    a placement part configured to place a substrate and rotate;
    a liquid supplier configured to supply a liquid to a surface of the substrate, the surface being cleaned;
    a cooling gas supplier configured to supply a gas to a surface of the substrate on a side of the placement part, the gas being cooled by the cooling device; and a second controller configured to control a rotation speed of the substrate, a supply amount of the liquid, and a first controller of the cooling device.

13. The substrate treatment device according to claim 12, wherein
the cooling gas supplier includes a cooling nozzle supplying the cooled gas to the surface of the substrate, and
a first thermometer of the cooling device is provided at a discharge port of the cooling nozzle.

14. A substrate treatment device, comprising:
the cooling device according to claim 5;
a placement part configured to place a substrate and rotate;
a liquid supplier configured to supply a liquid to a surface of the substrate, the surface being cleaned;
a cooling gas supplier configured to supply a gas to a surface of the substrate on a side of the placement part, the gas being cooled by the cooling device; and
a second controller configured to control a rotation speed of the substrate, a supply amount of the liquid, and a first controller of the cooling device.

15. The substrate treatment device according to claim 14, wherein
the cooling gas supplier includes a cooling nozzle supplying the cooled gas to the surface of the substrate, and
a first thermometer of the cooling device is provided at a discharge port of the cooling nozzle.

16. A cooling method of a gas, the gas being cooled by flowing a refrigerant into a heat exchanger and exchanging heat with the supplied gas, the method comprising:
controlling a temperature of the refrigerant flowing into the heat exchanger by switching a first control and a second control, the first control being based on a temperature of the cooled gas, the second control being based on the temperature of the refrigerant flowing into the heat exchanger,
the first control when a flow rate of the gas supplied to the heat exchanger is equal to a predetermined value or more, and
the second control when a flow rate of the gas supplied to the heat exchanger is less than a predetermined value.

17. A substrate treatment method, a substrate being treated by using the cooling method according to claim 16, the method comprising:
the substrate treatment method including
carrying-in the substrate on a placement part;
supplying a liquid to one surface of the substrate;
supplying the cooled gas to another surface of the substrate;
freezing at least a part of the liquid on the surface of the substrate;
thawing the frozen liquid;
drying the substrate with the thawed liquid; and
carrying-out the dried substrate from the placement part,
in the freezing at least a part of the liquid, the gas being cooled by the first control in the cooling method of the gas,
in the carrying-in the substrate, the thawing the substrate, the drying the substrate, the carrying-out the substrate, the gas being cooled by the second control in the cooling method of the gas.

18. A substrate treatment device, comprising:
a flow path configured to flow a refrigerant:
a condenser provided in the flow path:
a heat exchanger provided in the flow path:
a compressor provided in the flow path between the condenser and the heat exchanger:
a cooler cooling the refrigerant flowing from the condenser into the heat exchanger:
a gas cooling part supplying a gas to the heat exchanger:
the heat exchanger configured to cool the gas by exchanging heat exchange between the refrigerant and the gas,
a first thermometer configured to detect a temperature of the cooled gas by the gas cooling part:
a second thermometer configured to detect a temperature of the refrigerant flowing into the heat exchanger: and
a first controller configured to control the temperature of the cooled refrigerant by the cooler, the refrigerant flowing into the heat exchanger,
the first controller controlling the temperature of the cooled refrigerant flowing into the heat exchanger by switching a first control and a second control, the first control being based on the temperature detected by the first thermometer, the second control being based on the temperature detected by the second thermometer,
a placement part configured to place a substrate and rotate;
a liquid supplier configured to supply a liquid on a surface of the substrate, the surface being cleaned;
a cooling gas supplier configured to supply a gas to a surface of the substrate on a side of the placement part, the gas being cooled by the cooling device; and
a second controller configured to control a rotation speed of the substrate, a supply amount of the liquid, and a first controller of the cooling device.

19. The substrate treatment device according to claim 18, wherein
the cooling gas supplier includes a cooling nozzle supplying the cooled gas to the surface of the substrate, and
a first thermometer of the cooling device is provided at a discharge port of the cooling nozzle.

* * * * *